(12) United States Patent
Lim et al.

(10) Patent No.: US 7,751,224 B2
(45) Date of Patent: Jul. 6, 2010

(54) DATA WRITING AND READING METHOD FOR MEMORY DEVICE EMPLOYING MAGNETIC DOMAIN WALL MOVEMENT

(75) Inventors: Chee-kheng Lim, Yongin-si (KR);
Eun-sik Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 466 days.

(21) Appl. No.: 11/750,376

(22) Filed: May 18, 2007

(65) Prior Publication Data
US 2008/0068936 A1    Mar. 20, 2008

(30) Foreign Application Priority Data
Sep. 15, 2006    (KR) ...................... 10-2006-0089649

(51) Int. Cl.
*G11C 19/00*    (2006.01)
(52) U.S. Cl. ........................... 365/80; 365/81; 365/148; 365/158; 365/171; 365/173; 977/933
(58) Field of Classification Search .................. 365/48, 365/66, 78, 80–85, 100, 148, 158, 171, 173, 365/225.5, 243.5; 257/421, E21.665; 438/3; 977/933–935
See application file for complete search history.

(56) References Cited

U.S. PATENT DOCUMENTS

| 2004/0252538 | A1* | 12/2004 | Parkin | ........................ 365/80 |
| 2004/0252539 | A1* | 12/2004 | Parkin | ........................ 365/80 |
| 2005/0078511 | A1 | 4/2005 | Parkin | |

FOREIGN PATENT DOCUMENTS

JP    2006-005308    1/2006

OTHER PUBLICATIONS

Office Action dated May 31, 2007 for corresponding Korean Application No. 10-2006-0089649.

* cited by examiner

*Primary Examiner*—Richard Elms
*Assistant Examiner*—Harry W Byrne
(74) *Attorney, Agent, or Firm*—Harness, Dickey & Pierce, P.L.C.

(57) ABSTRACT

A method of data recording and reading for a memory device employing magnetic domain wall movement. The memory device includes a writing track, an interconnecting layer formed on the writing track, and a recording track formed on the interconnecting layer.

16 Claims, 12 Drawing Sheets

DATA WRITING AND READING METHOD FOR MEMORY DEVICE EMPLOYING MAGNETIC DOMAIN WALL MOVEMENT

CROSS-REFERENCE TO RELATED PATENT APPLICATION

This application claims priority from Korean Patent Application No. 10-2006-0089649, filed on Sep. 15, 2006, in the Korean Intellectual Property Office, the disclosure of which is incorporated herein in its entirety by reference.

BACKGROUND OF THE INVENTION

1. Field of the Invention

Methods consistent with the present invention relate to data writing and reading of a memory device, and more particularly, to data writing and reading of a memory device employing magnetic domain wall movement.

2. Description of the Related Art

Due to developments in information technology leading to a requirement for high capacity data storage, demand for data storage media capable of storing large quantities of data continues to increase. Accordingly, data storage speed has been augmented, methods of compacting storage devices have been developed, and as a result, a wide variety of data storage devices has been developed. A widely-used data storage medium is a hard disk drive (HDD), which includes a read/write head, and a rotating medium on which data is recorded, and has the capacity for recording 100 gigabytes (GB) of data or more. However, the rotating parts in storage devices such as HDDs have a tendency to wear, so that the reliability of such devices is compromised by the likelihood of a failure during operation after a prolonged period of use.

Research and development is currently underway on a new data storage device that uses a magnetic domain wall movement principle.

FIGS. 1A through 1C illustrate a principle of moving a magnetic domain wall. In FIG. 1A, a magnetic wire includes a first magnetic domain 11, a second magnetic domain 12, and a magnetic domain wall 13 between the first and second magnetic domains 11 and 12.

A magnetic micro region within a magnetic material will hereinafter be referred to as a magnetic domain. In the magnetic domain, the rotation of electrons, that is, the direction of the magnetic moment of the electrons is the same. The size and magnetization direction of such a magnetic domain can be adjusted by altering the type of magnetic material, its shape, and size, as well as applied external energy. A magnetic domain wall is a partition with magnetic domains having respectively a variety of different magnetized magnetization directions. The magnetic domain walls may be moved through the application of a magnetic field, a current applied to a magnetic material or through a current.

As illustrated in FIG. 1A, after a plurality of magnetic domains disposed in predetermined directions are created in a magnetic layer with a predetermined width and thickness, the magnetic domains may be moved using magnetic fields or currents.

Referring to FIG. 1B, when a magnetic field is applied in a direction from the second magnetic domain 12 to the first magnetic domain 11, the magnetic domain wall 13 may move in the same direction as the direction from the second magnetic domain 12 to the first magnetic domain 11, that is, in the same direction of the application of the external magnetic field. Using the same principle, when a magnetic field is applied in a direction from the first magnetic domain 11 to the second magnetic domain 12, the magnetic domain wall 13 moves in a direction from the first magnetic domain 11 to the second magnetic domain 12.

Referring to FIG. 1C, when an external current is supplied in the direction from the first magnetic domain 11 to the second magnetic domain 12, the magnetic domain wall 13 moves in a direction from the second magnetic domain 12 to first magnetic domain 11. When a current is supplied, electrons flow in the opposite direction to the direction of the current, and the magnetic domain wall 13 moves in the same direction as the electrons. The magnetic domain wall moves in the direction opposite to that of the externally supplied current. When a current is supplied in the direction of the first magnetic domain wall 11 from the second magnetic wall 12, using the same principle, the magnetic domain wall 13 moves in a direction from the first domain 11 to the second domain 12.

In summary, a magnetic domain wall can be moved using an applied external magnetic field or current.

The principle of moving magnetic domains may be applied to a memory device such as an HDD or a read only memory (ROM). Specifically, an operation for reading/writing binary data of '0' and '1' is possible by using the principle of changing the magnetic arrangement within a magnetic material by moving a magnetic domain wall of the magnetic material having magnetic domains magnetized in predetermined directions and magnetic domain walls representing the boundaries there between. A specific current is passed through a linear magnetic material to change the positions of the magnetic domain walls to read and write data. Thus, a highly integrated device with a simple structure may be used. Therefore, compared to conventional memories, such as ferroelectric random access memory (FRAM), magneto-resistive random access memory (MRAM), and phase-change random access memory (PRAM) devices, the principle of moving a magnetic domain wall can be applied to memory devices with much larger storage capacities. However, applying the moving of magnetic domain walls to semiconductor devices is still in the initial stages of development, and has a comparatively low data storage density. Therefore, there is a need for memory devices employing magnetic domain wall movement with structures optimized for high-density devices.

SUMMARY OF THE INVENTION

The present invention provides a method of data recording in a memory device employing magnetic domain wall movement.

The present invention also provides a method of reading data written in a memory device employing magnetic domain wall movement.

According to an aspect of the present invention, there is provided a method of recording data in a memory device including a writing track, an interconnecting layer formed on the writing track, and a data recording track formed on the interconnecting layer, and employing movement of a magnetic domain wall, the method including: positioning a first magnetic domain with a spin direction to write data on the writing track contacting the interconnecting layer; magnetizing the interconnecting layer contacting the writing track to have a same spin direction as the first magnetic domain; and forming a second magnetic domain having the same spin direction as the first magnetic domain on the data recording track contacting the interconnecting layer.

The positioning of the first magnetic domain may include moving the first magnetic domain to an area contacting the interconnecting layer, through applying a current through both ends of the writing track.

The forming of the second magnetic domain may include applying a current in a direction from the data recording track to the writing track, and forming the second magnetic domain on the data recording track.

The writing track and the data recording track may be formed of a magnetic material having a magnetic anisotropy constant value of between $10^5$ J/m$^3$ and $10^7$ J/m$^3$.

The writing track and the data recording track may be formed with a material including at least one of CoPt and FePt.

The interconnecting layer may be formed of a magnetic material having a magnetic anisotropy constant between $10^2$ and $10^3$ J/m$^3$.

The interconnecting layer may be formed of at least one of NiFe, CoFe, Ni, Fe, Co, and an alloy including at least one thereof.

According to another aspect of the present invention, there is provided a method of reading data in a memory device including a writing track with a magnetic resistance sensor, an interconnecting layer formed on a first end of the writing track, and a data recording track formed on the interconnecting layer, and employing a movement of a magnetic domain wall, the method including: moving magnetic domains of the writing track with mutually different magnetized directions towards a second end of the writing track; moving magnetic domains of the data recording track through the interconnecting layer toward the writing track; and detecting magnetized directions of the magnetic domains moved from the data recording track to the writing track through the magnetic resistance sensor.

The magnetic domains of the writing track may be moved through applying a current through the first end and the second end of the writing track.

The magnetic domains of the data recording track may be moved by applying a current through the data recording track and the magnetic resistance sensor.

The detecting of the magnetized directions may include applying a voltage to the data recording track and the writing track after magnetic domains are moved from the data recording track to the writing track, and contacting the magnetic domains moved to the writing track with the magnetic resistance device.

BRIEF DESCRIPTION OF THE DRAWINGS

The above and other aspects of the present invention will become more apparent and more readily appreciated from the following detailed description of certain exemplary embodiments of the invention, taken in conjunction with the accompanying drawings of which.

DETAILED DESCRIPTION OF EXEMPLARY EMBODIMENTS OF THE INVENTION

Figure 1A:
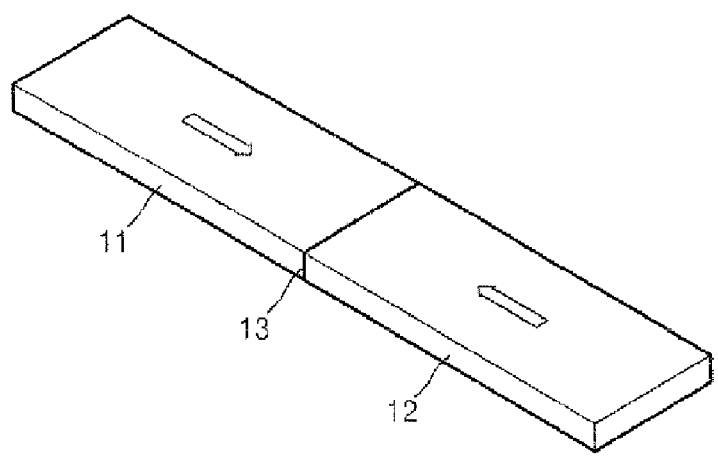
FIGS. 1A through 1C are perspective views illustrating a moving principle of a magnetic domain wall.
Figure 1B:
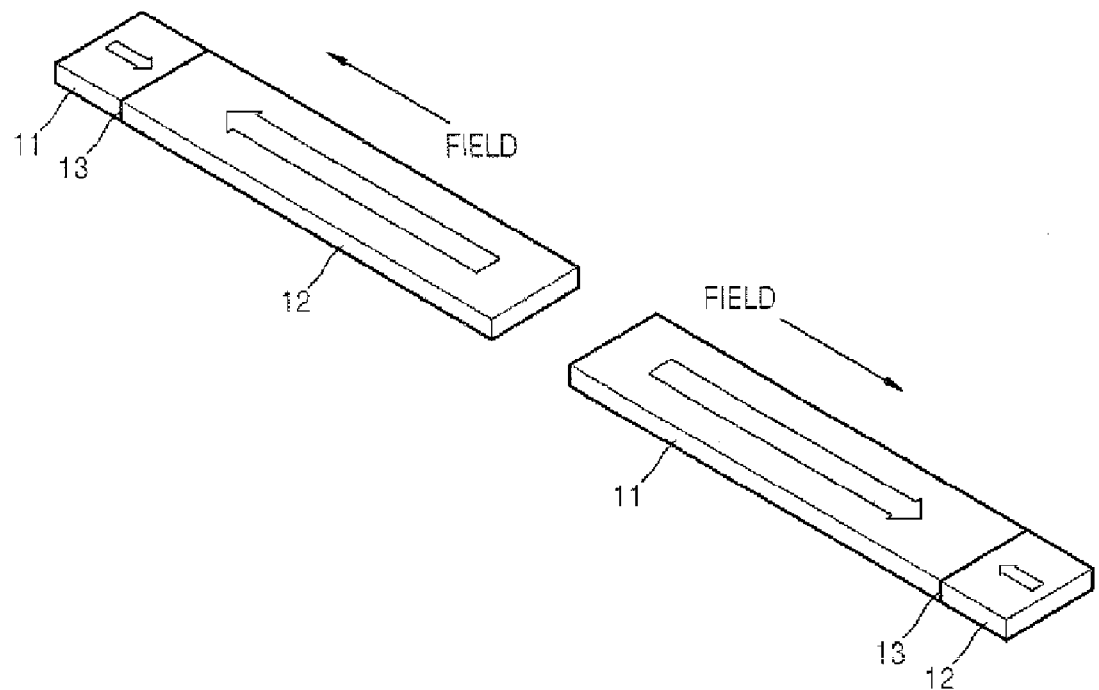
Figure 1C:
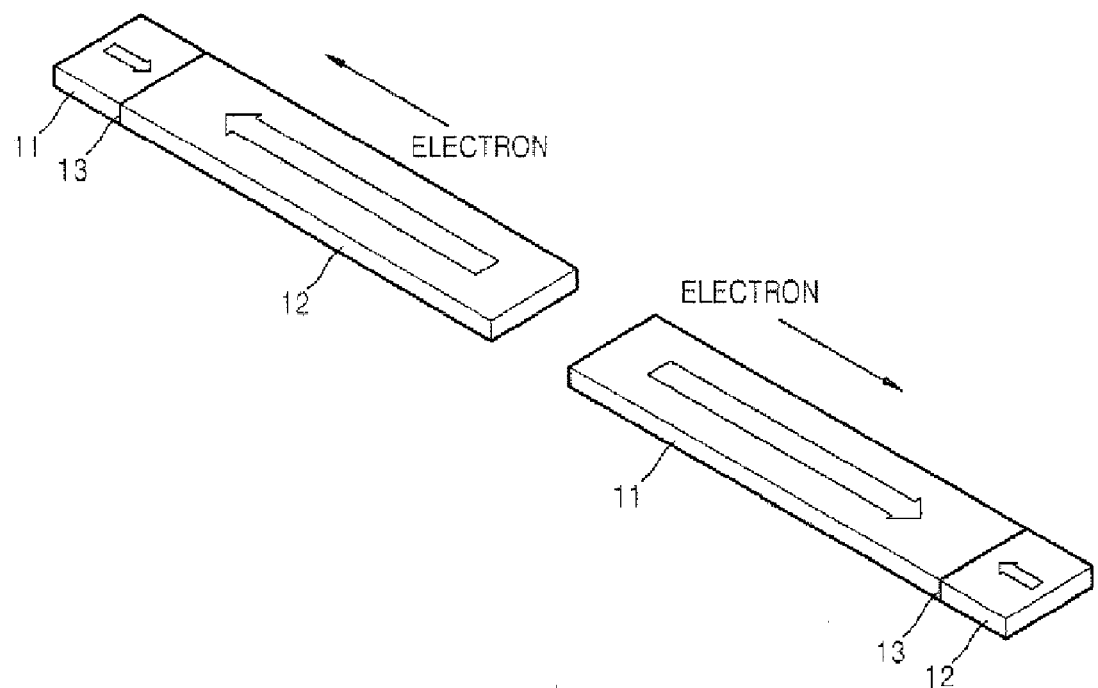

The method of writing and reading data in a memory device employing a magnetic domain wall movement according to the present invention will now be described more fully with reference to the accompanying drawings, in which exemplary embodiments of the invention are shown. In the drawings, the thicknesses and widths of layers are exaggerated for clarity.

Figure 2:
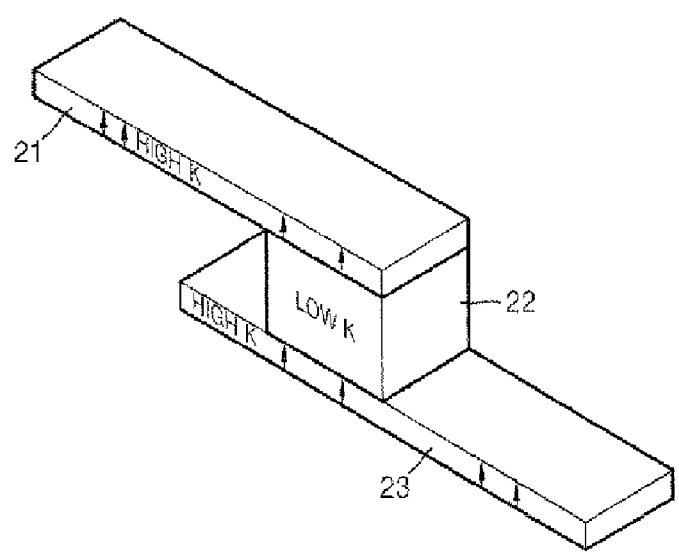
FIG. 2 is a perspective view of a memory device employing magnetic domain wall movement, according to an exemplary embodiment of the present invention.

FIG. 2 is a perspective view of a memory device employing magnetic domain wall movement, according to an exemplary embodiment of the present invention.

Referring to FIG. 2, a memory device, including a recording track 21 formed in a first direction, a writing track 23 formed in a second direction, and a soft magnetic interconnecting layer 22 formed between the recording track 21 and the writing track 23, is provided.

The recording track 21 and the writing track 23 are formed using material having high magnetic anisotropy characteristics to achieve increased data recording density. When a material having a magnetic anisotropy constant of $10^5$ J/m$^3$ or more is required, a high Ku material having a magnetic anisotropy energy constant of $10^5$ J/m$^3$ to $10^7$ J/m$^3$ may be used. Specific examples of such a materials are CoPt, FePt, and alloys thereof, which have perpendicular magnetization characteristics. The recording track 21 and writing track 23 may be formed in single layer or multi layer structures. The thickness of each of the recording track 21 and the writing track 23 may be 1 to 100 nm.

The interconnecting layer 22 is formed with a low Ku material with a magnetic anisotropy characteristic that is lower than those of the recording track 21 and writing track 23. When the interconnecting layer 22 is to be formed of a material with a magnetic anisotropy constant lower than $10^3$ J/m$^3$ a material having a magnetic anisotropy constant of between $10^2$ to $10^3$ J/m$^3$ may be used. Specific examples of such materials are NiFe, CoFe, Ni, Fe, Co, and alloys including at least one of the materials. When the thickness of the interconnecting layer 22 is required to be formed to 10 nm or more, it may be between 10 to 100 nm. The interconnecting layer 22 may be formed in a single or multi layer structure.

While the recording track 21 and writing track 23 in FIG. 2 are illustrated as being parallel with each other, they may be configured in various ways according to the conditions of use. For example, the recording track 21 and writing track 23 may be formed to cross or to be orthogonal to each other. Furthermore, the recording track 21 and writing track 23 may be formed in a wire configuration with a plurality of magnetic domains.

A data writing method of a memory device employing magnetic domain wall movement illustrated in FIG. 2 will be described in detail below, with reference to FIGS. 3A through 3H.

Figure 3A:
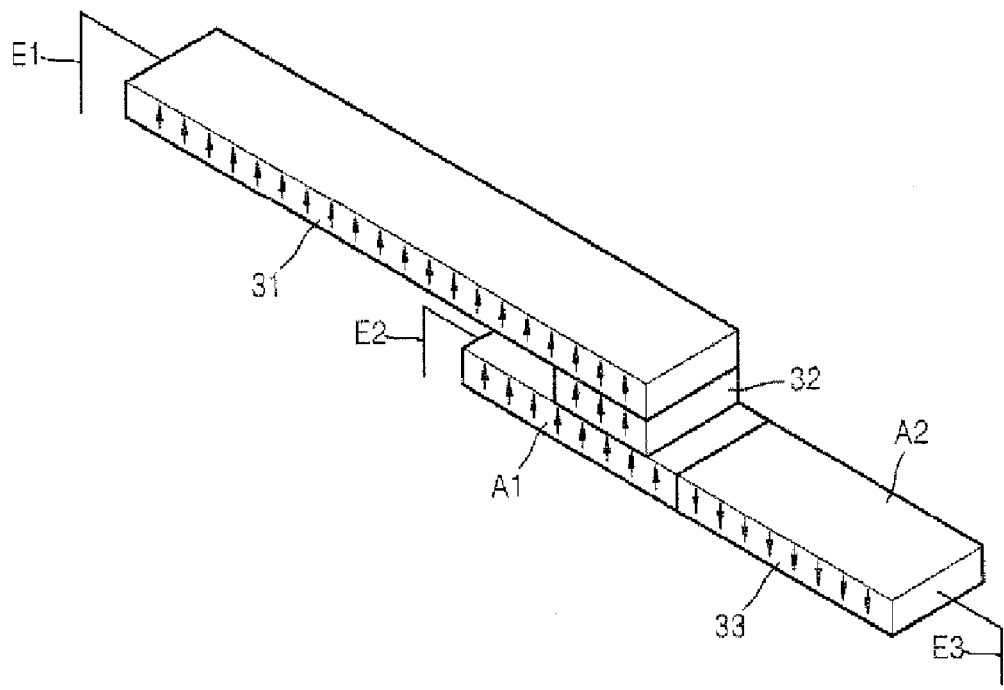
FIGS. 3A through 3H are perspective illustrating a method of writing data in a memory device employing a magnetic domain wall movement, according to an exemplary embodiment of the present invention.

Referring to FIG. 3A, a recording track 31 and a writing track 33 are formed having an interconnecting layer 32 formed there between. Connected to one end of the recording track 31 is a first conducting wire E1 formed of a conductive material, a second conductive wire E2 is formed connected to one end of the writing track 33, and a third conductive wire E3 is formed connected to the other end of the writing track 33. A magnetic domain region A1 having an magnetization direction pointing upward and a magnetic domain region A2 having a magnetization direction pointing downward are formed on the writing track 33. In the case of the recording track 31, the magnetization is arbitrarily shown in the upward direction. A magnetization in a downward direction is set as "0", and magnetization in an upward direction is set as "1". A description of recording data as "0" on the data recording track 31 when the magnetization is in a downward direction will be described below.

Figure 3B:
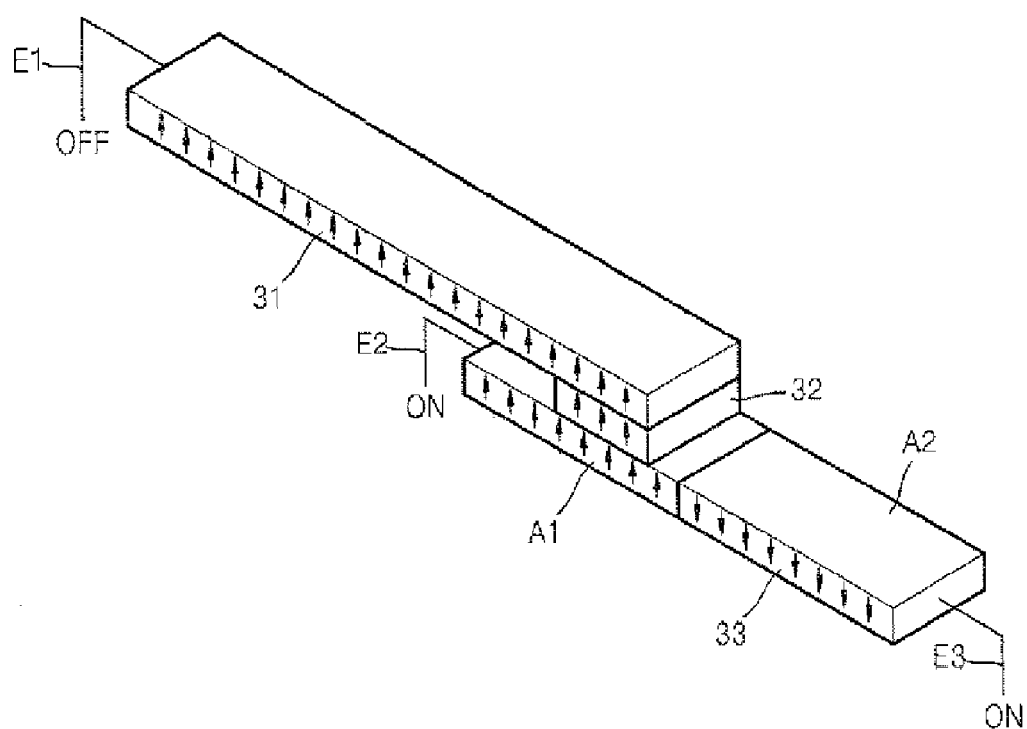

Referring to FIG. 3B, the second conductive wire E2 and the third conductive wire E3 are both set to an ON state and also a current is supplied through the second conductive wire E2 and the third conductive wire E3, which are connected on either end of the writing track 33.

Figure 3C:
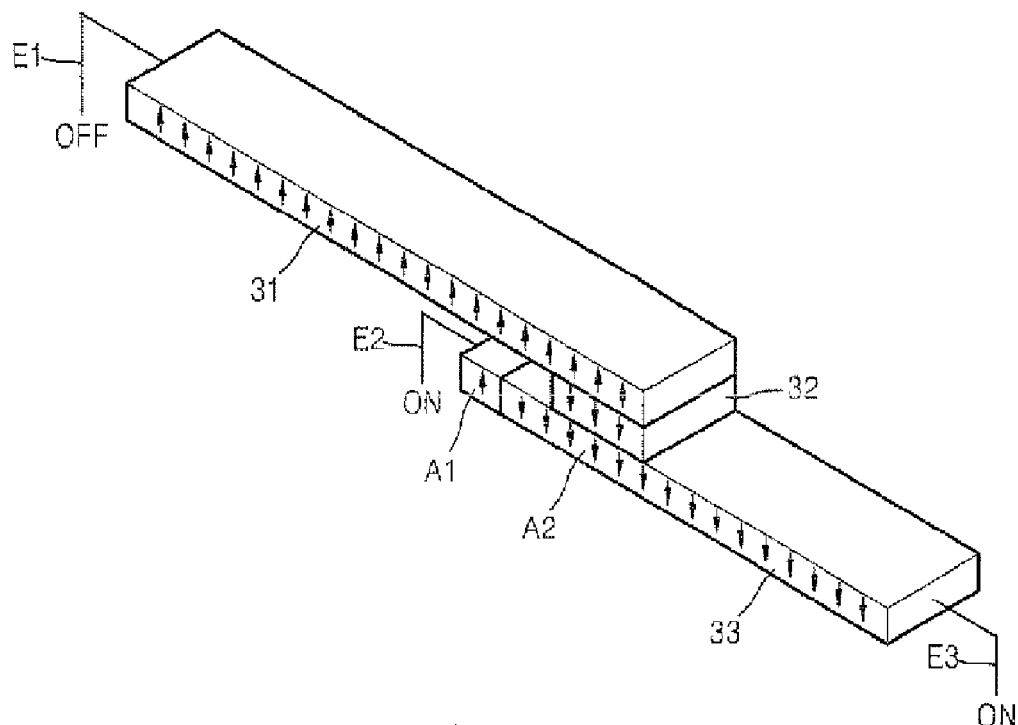

Referring to FIG. 3C, when a current is made to flow from the second conductive wire E2 towards the third conductive wire E3, a magnetic domain wall moves in the direction opposite to the flow of current. The magnetic domain wall moves in the direction of the movement of electrons, so that it moves in a direction opposite to the direction of the current. Accordingly, the magnetic domain wall moves toward the second conductive wire E2. As a result, the length of the magnetic domain A1 of the writing track 33 is reduced, and the length of the magnetic domain A2 is increased. When the magnetic domain A2 is positioned below the interconnecting layer 32, the interconnecting layer 32 is affected by the magnetic domain A2 and is magnetized in the same direction as the magnetic domain A2.

Figure 3D:
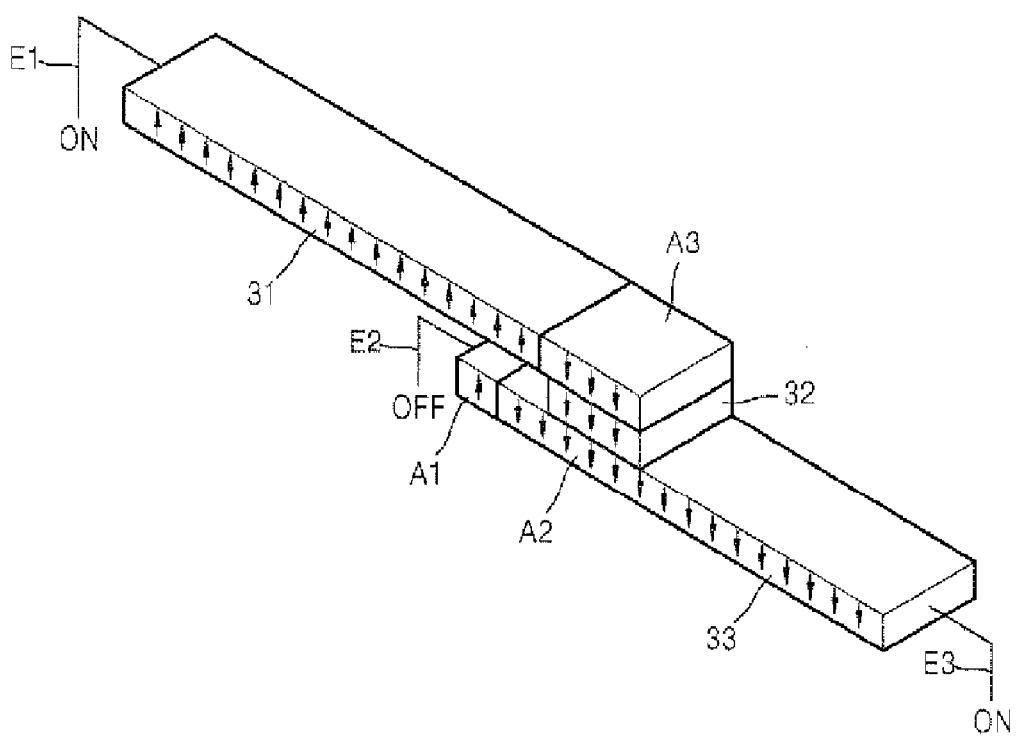

Referring to FIG. 3D, the second conductive wire E2 at the left end of the writing track 33 is set in an OFF state, and the first conductive wire E1 on the left end of the data recording track 31 is set in an ON state. Also, a current is made to flow through the first and third conductive wires E1 and E3. The direction of current flow is set from the first conductive wire E1 to the third conductive wire E3, the magnetic domain A2 with a downward magnetization expands towards the data recording track 31 through the interconnecting layer 32, and the magnetization in a downward direction in the magnetic domain A3 expands towards the left end of the data recording track 31, and as such data "0" is recorded.

Figure 3E:
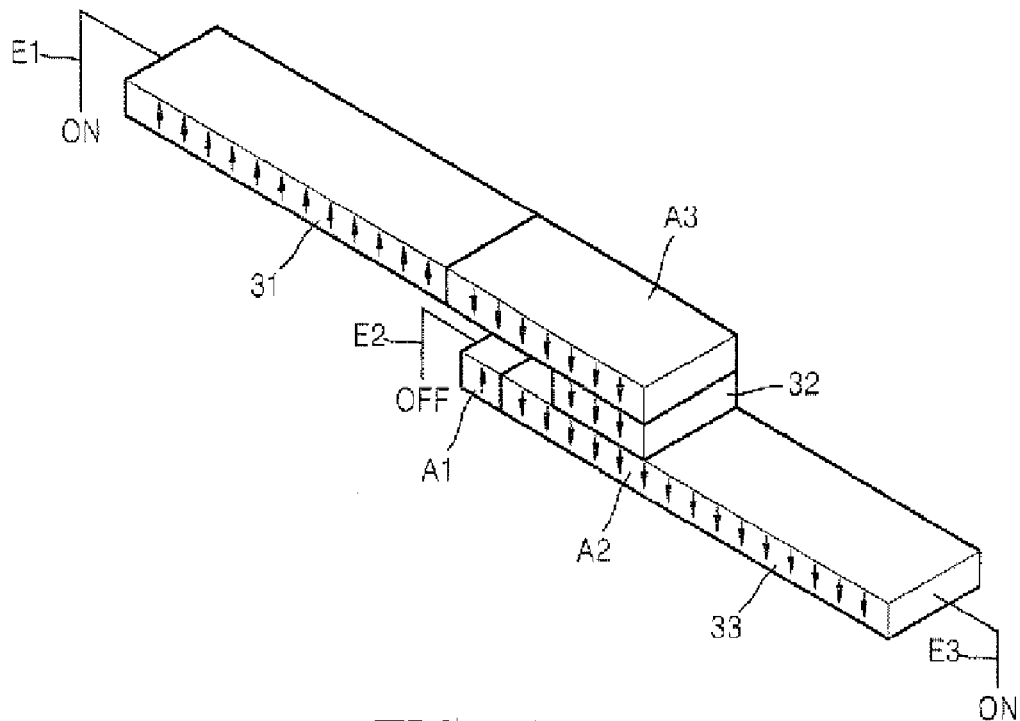

Referring to FIG. 3E, in order to expand the magnetic domain A3 toward the left side of the data recording track 31, a current is made to flow from the first conductive wire E1 towards the third conductive wire E3.

Next, after the data "0" is recorded on the data recording track 31, a process of recording a magnetic domain region with an upward magnetization, that is, with data "1" on the data recording track 31 will be described.

Figure 3F:
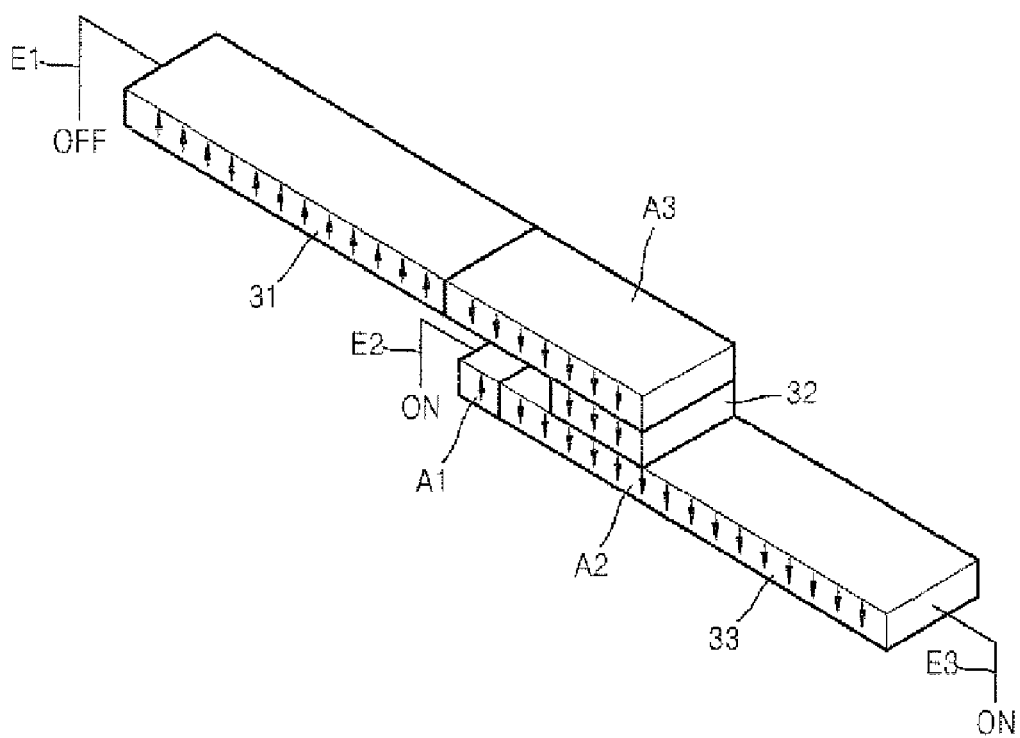

Referring to FIG. 3F, the first conductive wire E1 is set in an OFF state, and the second conductive wire E2 and the third conductive wire E3 are set in an ON state, and current is supplied.

Figure 3G:
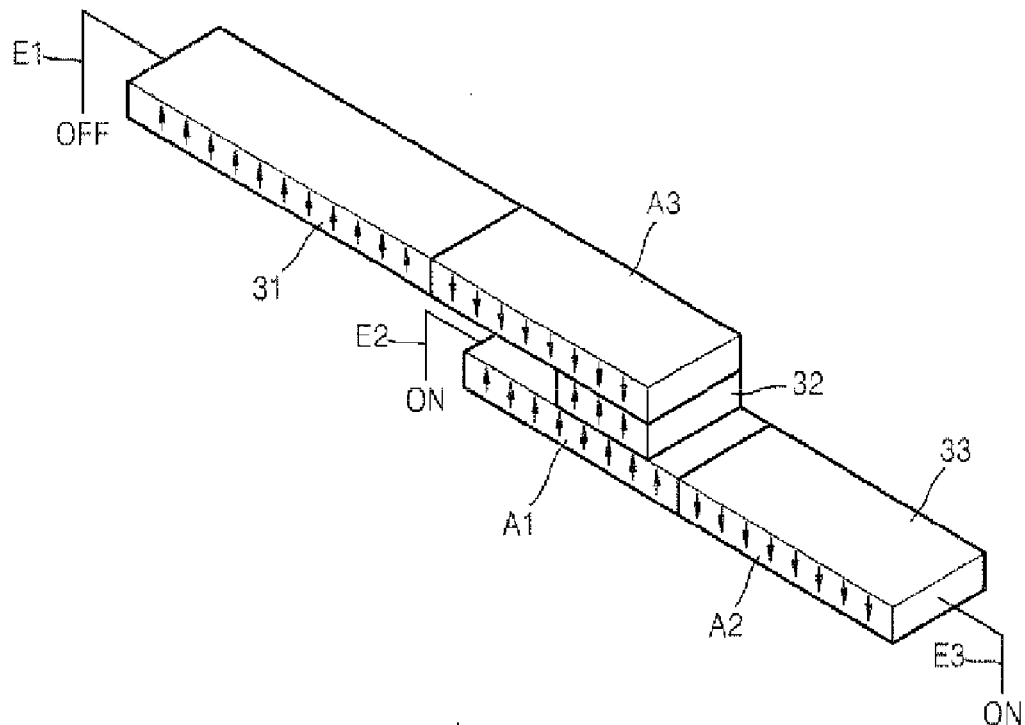

Referring to FIG. 3G, current is made to flow from the third conductive wire E3 toward the second conductive wire E2. When current flows from the third conductive wire E3 toward the second conductive wire E2, electrons move from the second conductive wire E2 towards the third conductive wire E3. Accordingly, the magnetic domain wall, that is a barrier between the magnetic domain A1 with an upward magnetization and the magnetic domain A2 with a downward magnetization, moves in a direction to the right of the writing track 33 towards the third conductive wire E3. Current is supplied until the magnetic domain wall between the magnetic domain A1 and the magnetic domain A2 passes through a region corresponding to the interconnecting layer 32. The magnetic domain A1 contacts the interconnecting layer 32, so that the interconnecting layer 32 adopts a magnetization in the same upward direction as the magnetic domain A1 of the writing track 33.

Figure 3H:
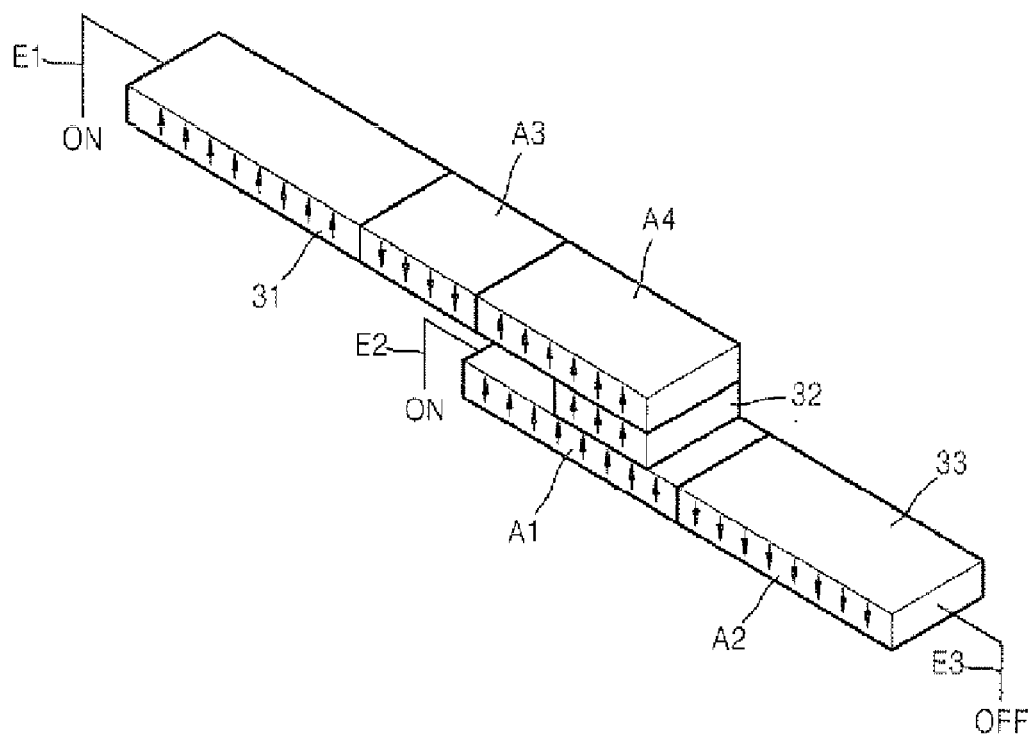

Referring to FIG. 3H, the first conductive wire E1 and the second conductive wire E2 are set in an ON state, and the third conductive wire E3 is set in an OFF state. When a current is supplied from the first conductive wire E1 towards the second conductive wire E2, electrons move from the second conductive wire E2 towards the first conductive wire E1. Accordingly, a magnetic domain A4 that is magnetized in an upward direction passes through the interconnecting layer 32 and expands in the data recording track 31. As a resultant, the downward magnetization direction of the portion of the data recording track 31 directly above the interconnecting layer 32 changes to the upward magnetization direction of the magnetic domain A4. Thus, a data region "1" is created to the right of the data region "0".

A detailed description of a data reading and writing method in a memory device employing magnetic domain wall movement as illustrated in FIG. 2 will be given below, with reference to FIGS. 4A through 4L.

Figure 4A:
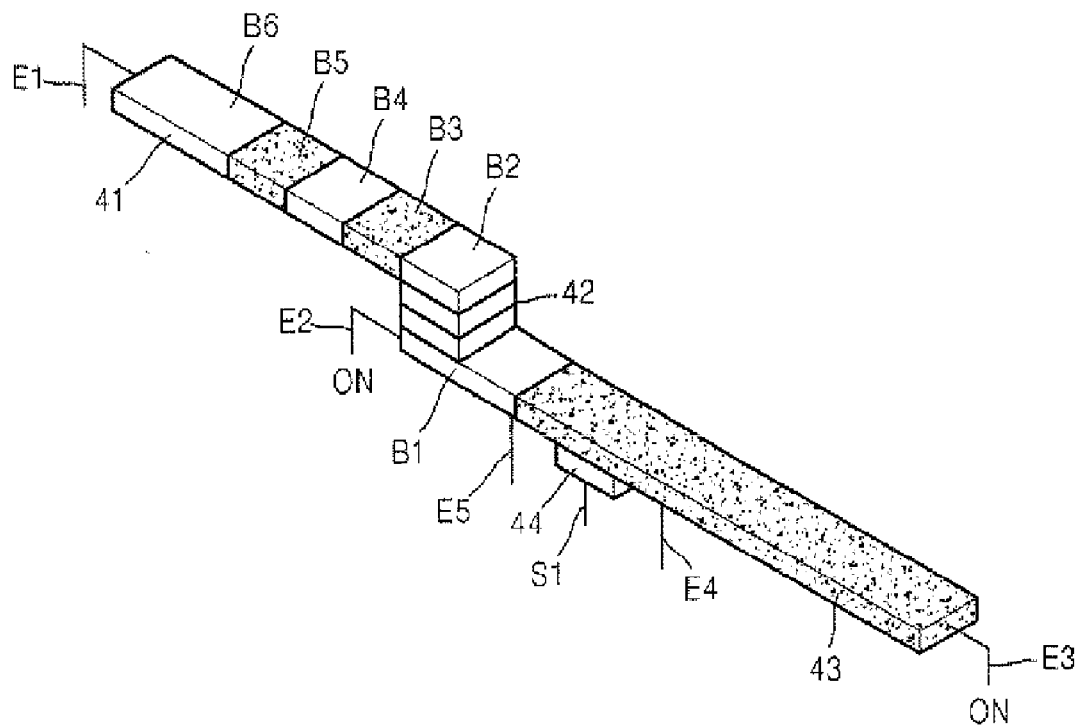
FIGS. 4A through 4L are perspective views illustrating a method of reading data in a memory device employing magnetic domain wall movement according to exemplary embodiments of the present invention.

Referring to FIG. 4A, recording track 41 and a writing track 43 are formed having an interconnecting layer 42 formed there between. The interconnecting layer 42 may be formed as a single layer or a multi layer. A first conductive wire E1 formed of a conductive material is formed connected to the left end of the recording track 41, a second conductive wire E2 is formed connected to one end of the writing track 43, and a third conductive wire E3 is formed connected to the other end of the writing track 43 A magneto-resistance sensor 44 for reading a magnetized direction of a magnetic domain in a predetermined location of the writing track 43 contacts the central region of the writing track 43. An electrode S1 for measuring a resistance state of the magneto-resistance sensor 44 is formed on the magnetic resistance sensor 44, and a fourth conductive wire E4 and a fifth conductive wire E5 for applying a current to the writing track 43 are formed on either side of the magnetic resistance sensor 44. The magneto-resistance sensor 44 may be a conventional giant magneto-resistance (GMR) sensor or a tunneling magneto-resistance (TMR) sensor that are capable of detecting the resistance direction in a recording medium.

Figure 4B:
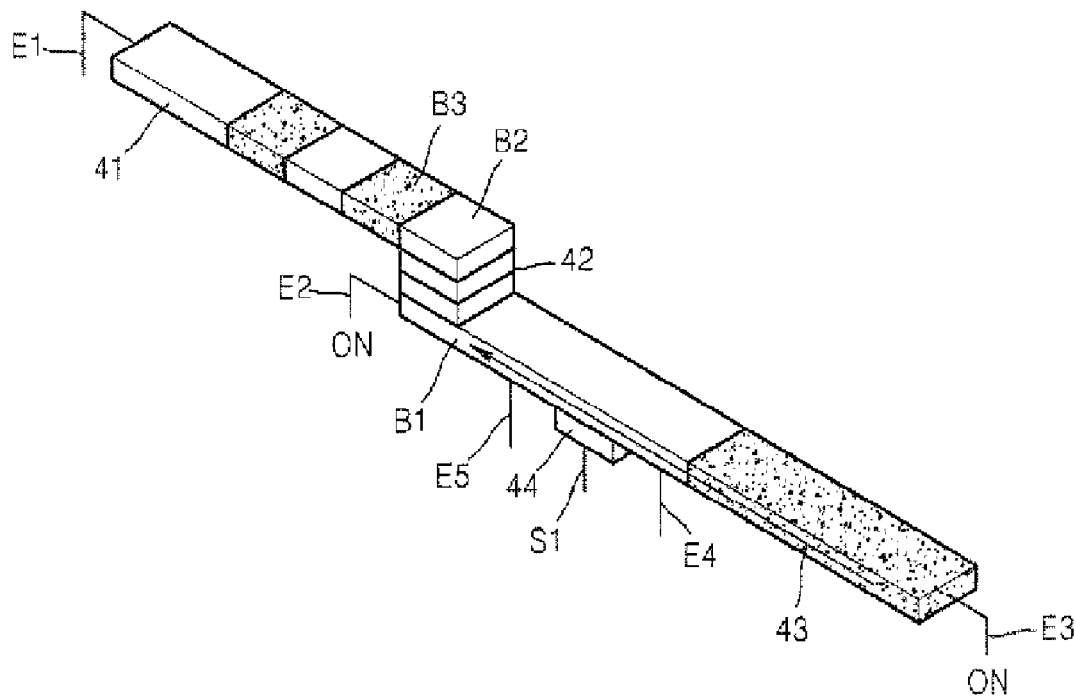

Referring to FIG. 4B, the writing track 43 must have two magnetic domains magnetized in mutually opposite directions in order to record data on the data recording track 41. Accordingly, in order to preserve the magnetic domains of the magnetic domain B1 magnetized in an upward direction and the magnetic domain magnetized oppositely to B1 in a downward direction, the first conductive wire E1 must first be set in an OFF state, and the second and third conductive wires E2 and E3 must be set in ON states. Also, current is made to flow from the third conductive wire E3 towards the second conductive wire E2. Thus, electrons move from the second conductive wire E2 towards the third conductive wire E3, and the area of the magnetic domain B1 expands towards the third conductive wire E3. Current is supplied until the magnetic domain B1 passes the region contacting the magneto-resistance sensor 44.

Figure 4C:
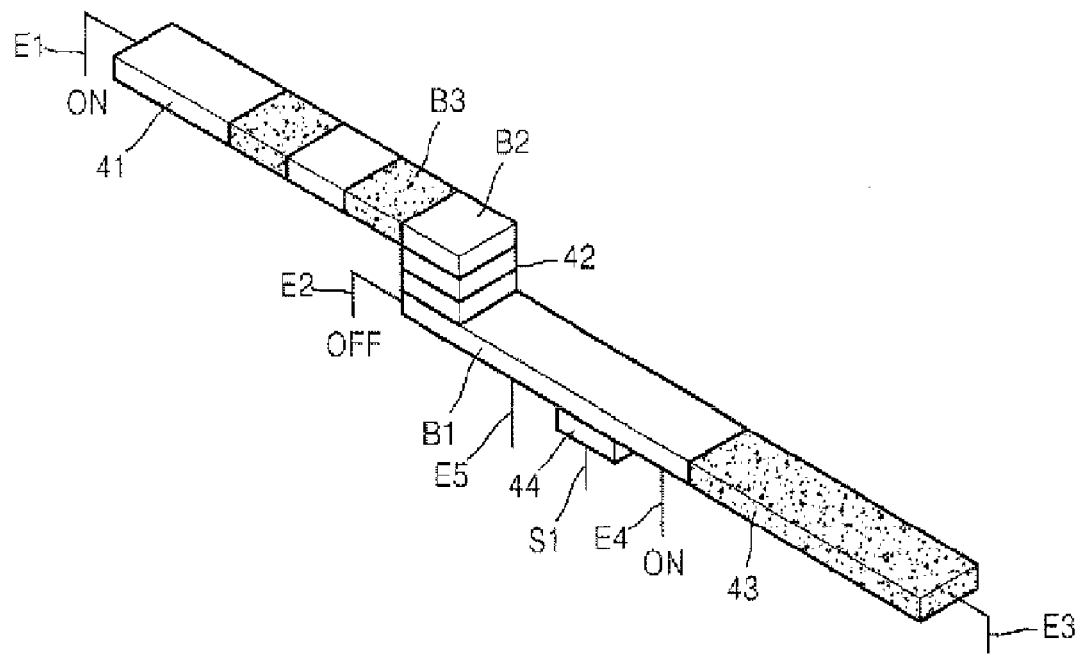

Referring to FIG. 4C, the first conductive wire E1 and the sensor electrode are set in an ON state, and the second conductive wire E2 and the third conductive wire E3 are set in an OFF state.

Figure 4D:
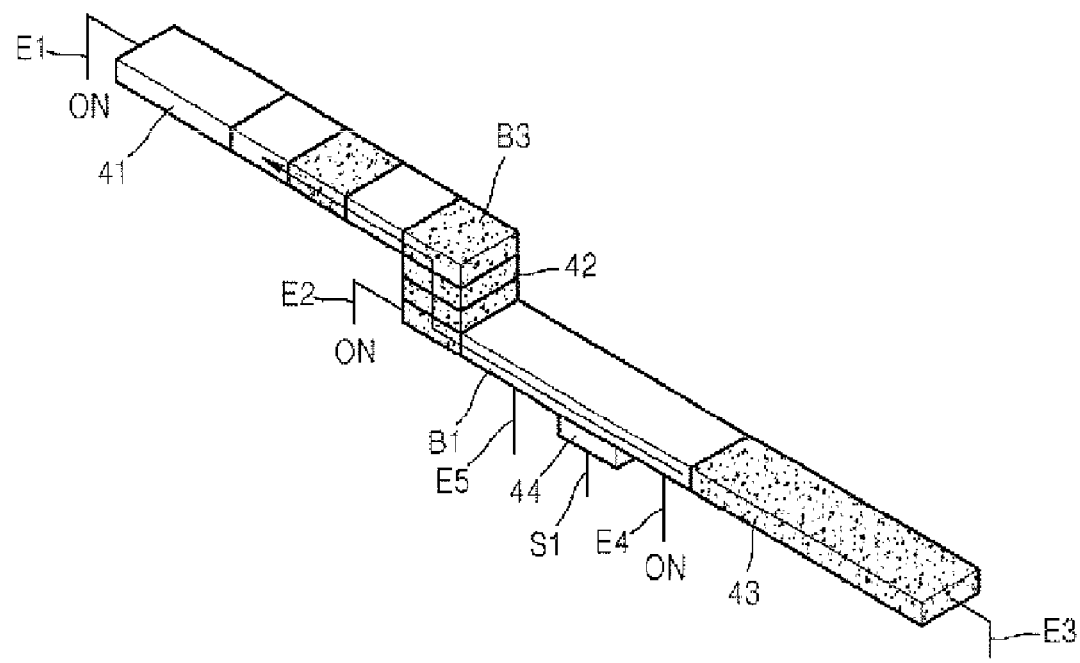

Referring to FIGS. 4C and 4D, current is supplied from the fourth conductive wire E4 towards the first conductive wire E1. Electrons move from the first conductive wire E1 towards the fourth conductive wire E4, so that the magnetic domain B2 and the magnetic domain B3 pass through the interconnecting layer 42 and move toward the writing track 43. The magnetic domain B2 is magnetized in the same direction as the magnetic domain B1, and combines with the magnetic domain B1.

Figure 4E:
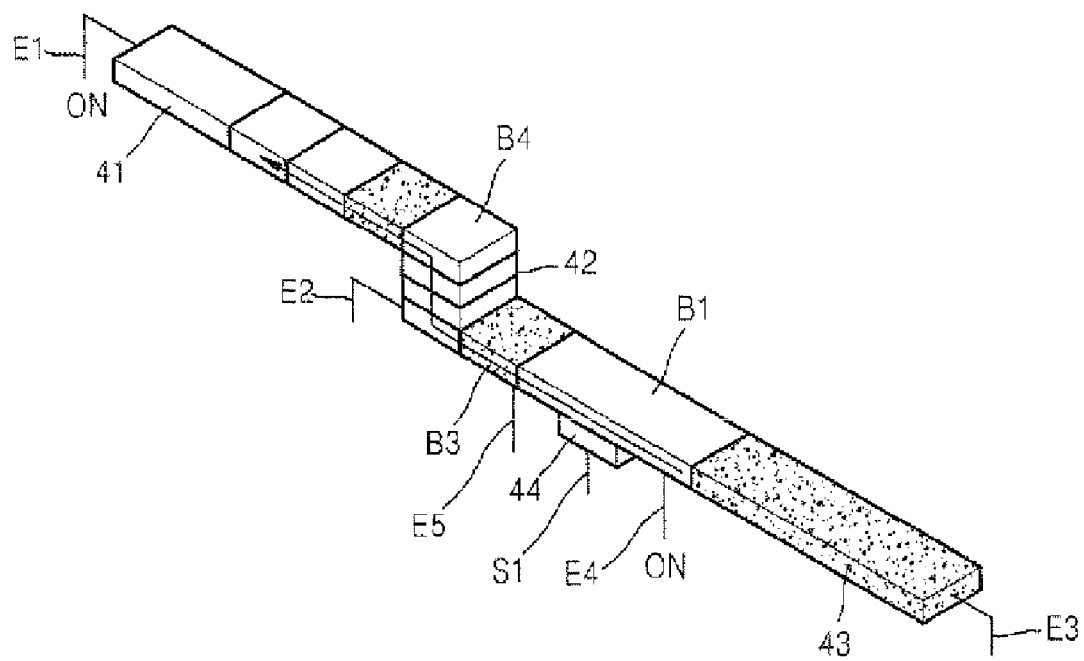
Figure 4F:
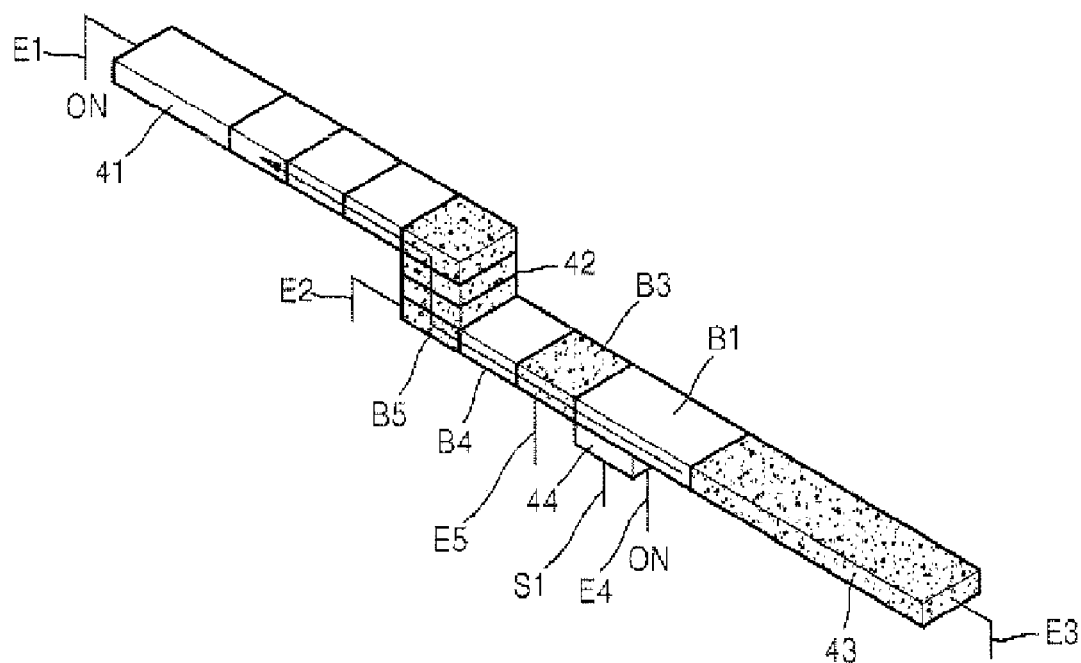
Figure 4G:
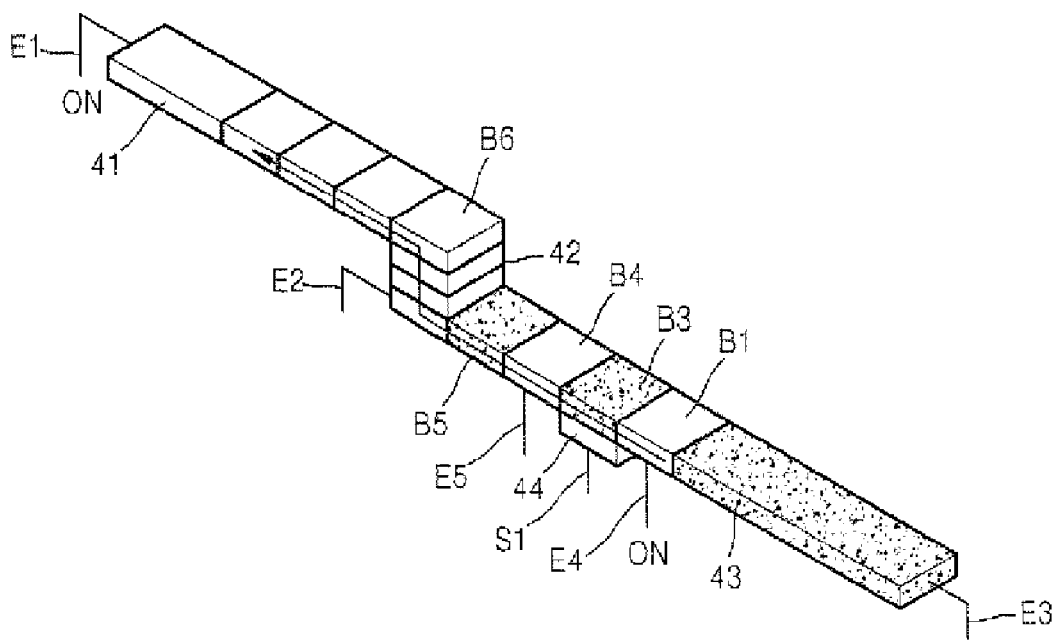

Referring to FIG. 4E, current is continuously supplied from the fourth conductive wire E4 towards the first conductive wire E1. Thus, the magnetic domains of the recording track 41 continuously move toward the writing track 43. By making current flow from the fourth conductive wire E4 towards the first conductive wire E1, the magnetic domain B1 of the writing track 43 does not move toward the third conductive wire E3, and the magnetic domain B3 and the magnetic domain B4 move from the recording track 41 so that the areas thereof gradually shrinks. As a result, current is supplied through the first conductive wire E1 and the fourth conductive wire E4 until the magnetic domains B5 and B6 move toward the writing track 43, as illustrated in FIGS. 4F and 4G.

Figure 4H:
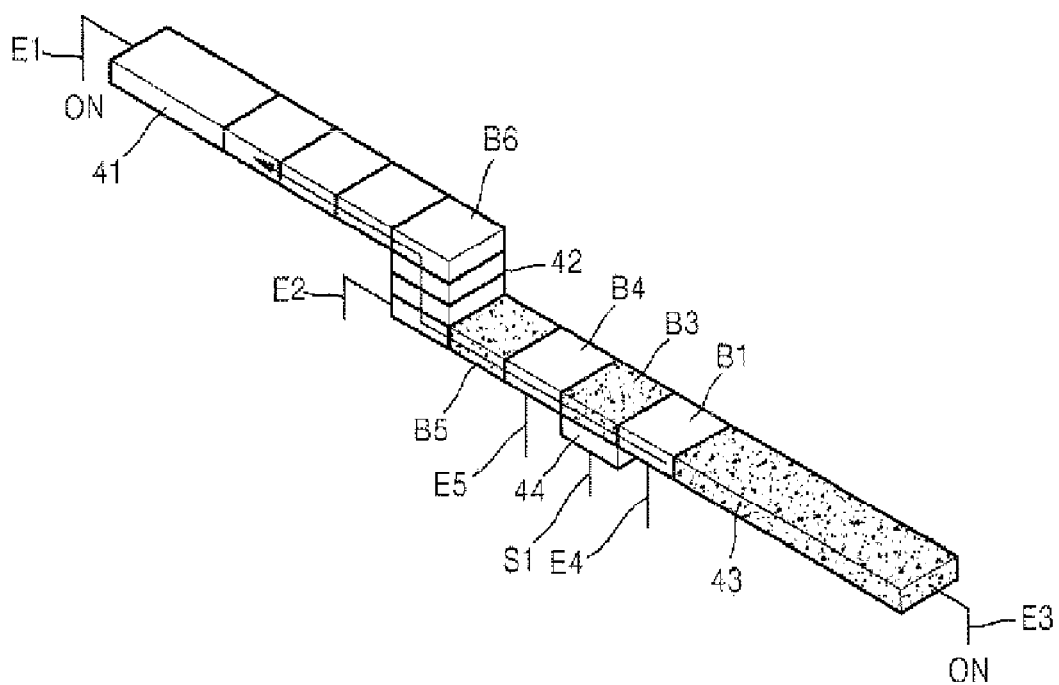

Referring to FIG. 4H, the first conductive wire E1 and the third conductive wire E3 are set in an ON state, and current is supplied from the third conductive wire E3 towards the first conductive wire E1. The electrons move from the first conductive wire E1 towards the third conductive wire E3, so that the magnetic wall moves in the same direction.

Figure 4I:
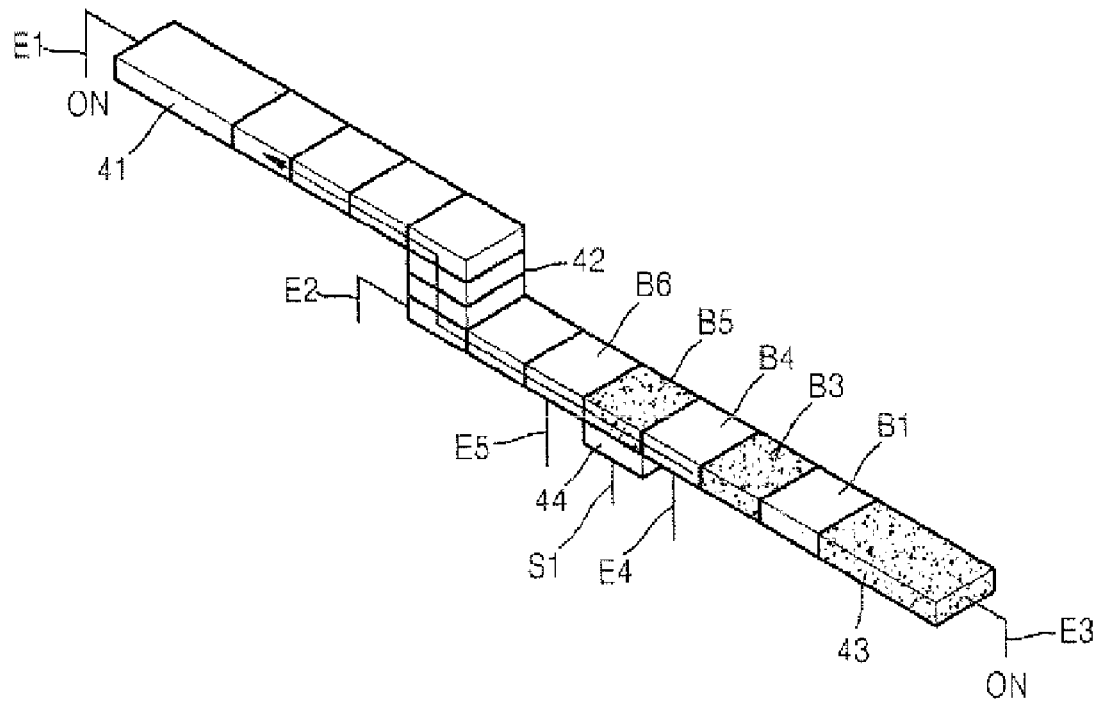

Referring to FIG. 4I, all the tracks of the data recording track 41 and the writing track 43, for example, magnetic domains B1, B3, B4, B5, and B6 move toward the third conductive wire E3 that is the right end of the writing track 43. When the magnetic domains pass the magneto-resistance sensor 44 contacting the writing track 43, the magneto-resistance sensor 44 reads the resistance directions of the magnetic domains to read the data recorded on the magnetic domains.

When all the data required is read, the magnetic domains of the writing track 43 are moved to the original positions on the recording track 41 to complete the reading operation.

Figure 4J:
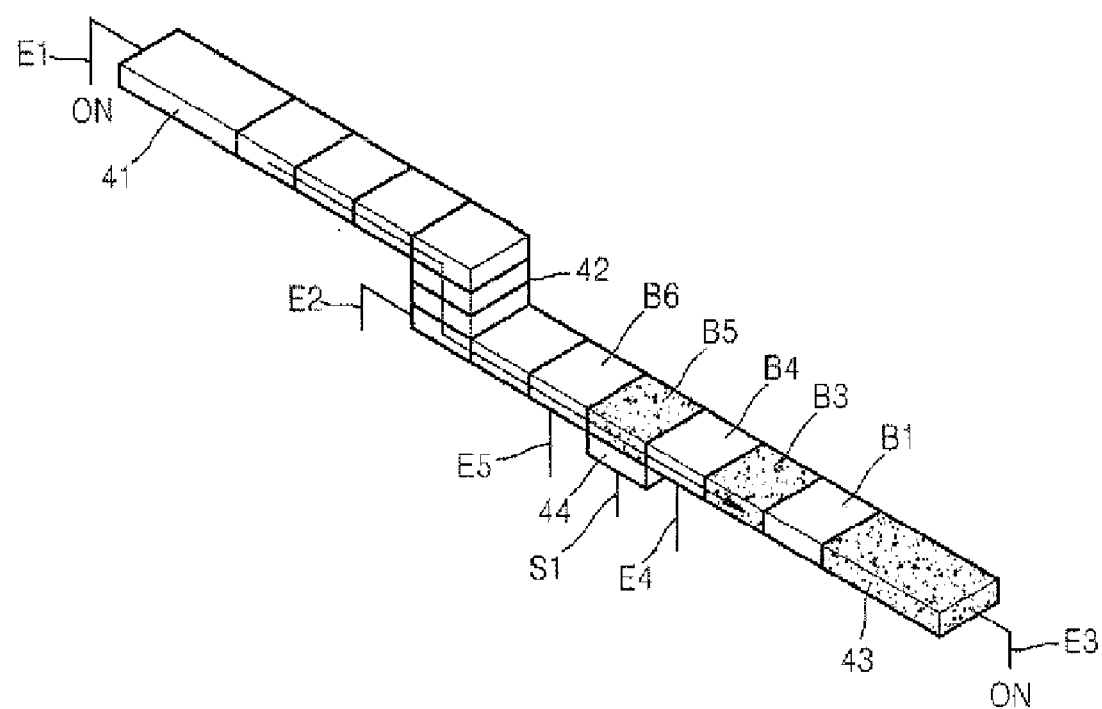
Figure 4K:
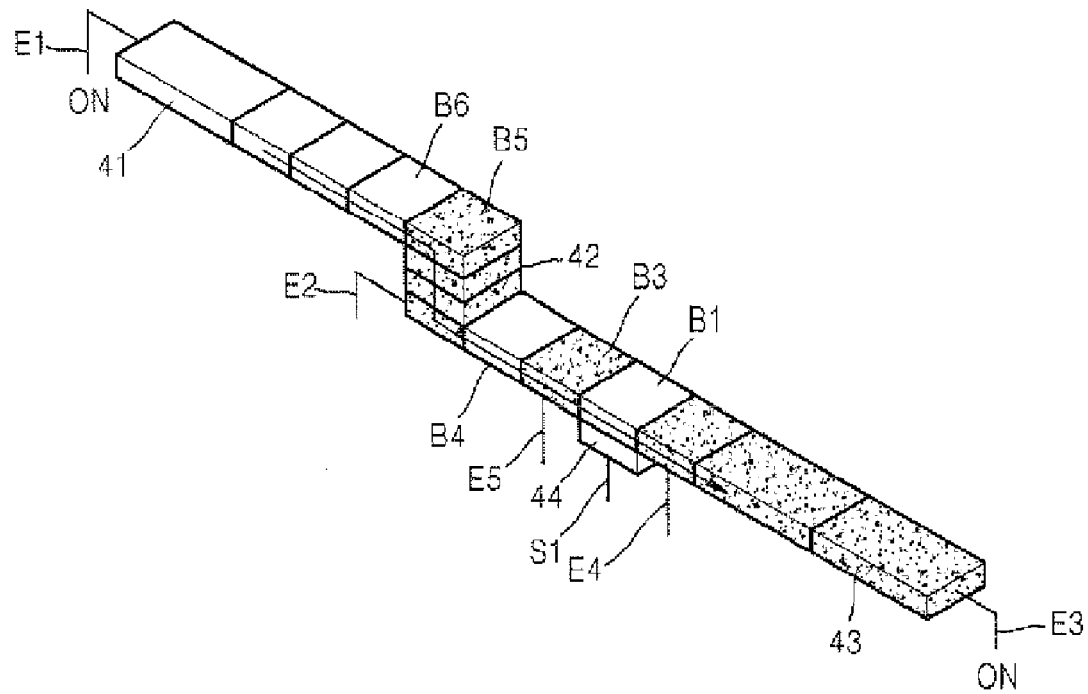
Figure 4L:
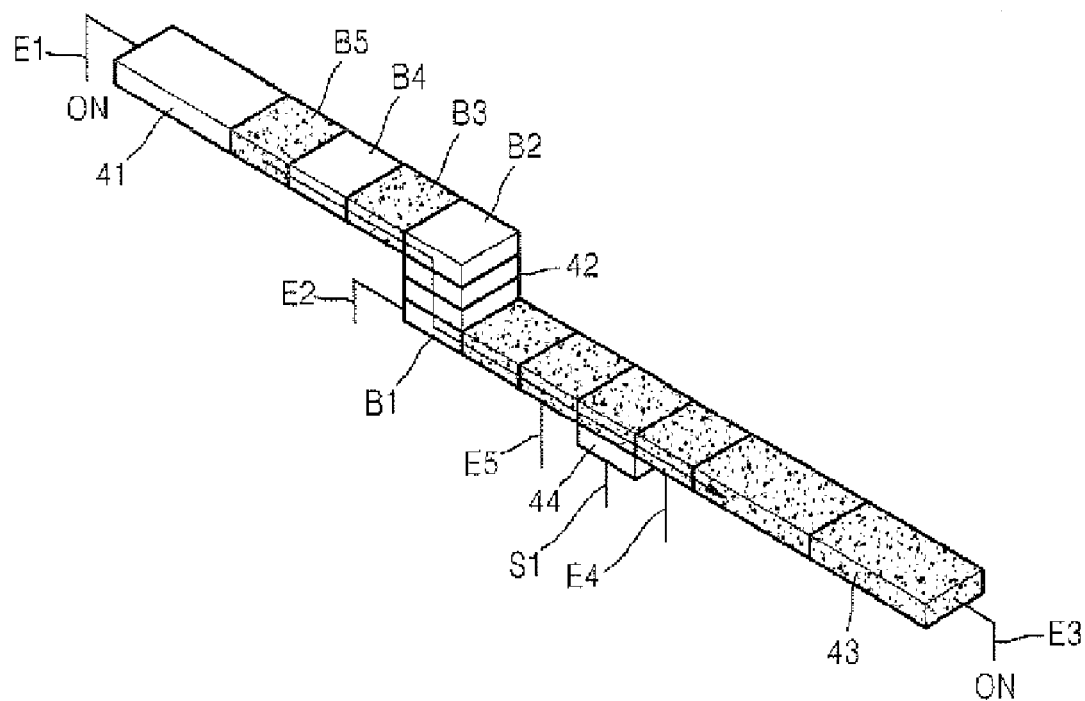

Referring to FIGS. 4J through 4L, the first conductive wire E1 and the third conductive wire E3 are set in an ON state. A current is supplied from the first conductive wire E1 towards the third conductive wire E3. Here, the electrons move from the third conductive wire E3 towards the first conductive wire E1, so that the magnetic domain wall moves in the same as the electron flow. The movement of the magnetic domain wall causes the magnetic domains B6, B5, B4, and B3 located on the writing track 43 to pass the interconnecting layer 42 and move towards the data recording track 41. Resultantly, a current is supplied through the first conductive wire E1 and the third conductive wire E3 until the magnetic domain B1 is positioned on the left end of the writing track 43, so that the magnetic domains move back to their original positions, completing the reading operation.

The present invention includes the following advantages.

First, when operating a memory device, unlike in an HDD, the magneto-resistance sensor and the data recording medium are not mechanically moved, and allow the recording and reading of data. Therefore, mechanical wear does not occur, extending the lifespan of the product, and providing outstanding reliability.

Second, the size of the memory device may be miniaturized, and the writing and reading of data is simplified, so that the device is appropriate for application in mobile devices. Also, due to its ability to be miniaturized, the memory device may be made into a high-density device capable of storing data having a density of terabits/in$^2$.

While the present invention has been particularly shown and described with reference to exemplary embodiments thereof, it will be understood by those of ordinary skill in the art that various changes in form and details may be made therein without departing from the spirit and scope of the present invention as defined by the following claims. For example, in the memory device according to the present invention, the magnetic resistance sensor may be disposed above the data recording track contacting a soft magnetic interconnecting layer, and not disposed below the writing track, and the fourth conductive wire may be formed in a predetermined location below the writing track. Therefore, the scope of the invention is defined not by the detailed description of the invention but by the appended claims, and all differences within the scope will be construed as being included in the present invention.

What is claimed is:

1. A method of recording data in a memory device comprising a writing track, an interconnecting layer disposed on the writing track, and a recording track disposed on the interconnecting layer, and employing movement of a magnetic domain wall, the method comprising:
    positioning a first magnetic domain having a magnetization direction to write data on a portion of the writing track contacting the interconnecting layer;
    magnetizing the interconnecting layer contacting the writing track to have a magnetization direction which is the same as the magnetization direction of the first magnetic domain; and
    forming a second magnetic domain having a magnetization direction which is the same as the magnetization direction of the first magnetic domain on a portion of the data recording track contacting the interconnecting layer.

2. The method of claim 1, wherein the writing track comprises the first magnetic domain and a third magnetic domain having a magnetization direction which is opposite to the magnetization direction of the first magnetic domain.

3. The method of claim 2, wherein the positioning of the first magnetic domain comprises moving the first magnetic domain to an area contacting the interconnecting layer, by making a current flow through both ends of the writing track.

4. The method of claim 1, wherein the forming of the second magnetic domain comprises making a current flow in a direction from the data recording track to the writing track, and forming the second magnetic domain on the data recording track.

5. The method of claim 1, wherein the writing track and the data recording track comprises a magnetic material having a magnetic anisotropy constant of between $10^5$ J/m$^3$ and $10^7$ J/m$^3$.

6. The method of claim 5, wherein the writing track and the data recording track comprise at least one of CoPt and FePt.

7. The method of claim 1, wherein the interconnecting layer comprises a magnetic material having a magnetic anisotropy constant of between $10^2$ and $10^3$ J/m$^3$.

8. The method of claim 7, wherein the interconnecting layer comprises at least one of NiFe, CoFe, Ni, Fe, Co, and an alloy comprising at least one NiFe, CoFe, Ni, Fe and Co.

9. A method of reading data in a memory device comprising a writing track having a magneto-resistance sensor, an interconnecting layer disposed on a first end of the writing track, and a data recording track disposed on the interconnecting layer, and employing a movement of a magnetic domain wall, the method comprising:
    moving magnetic domains of the writing track with mutually different magnetization directions toward a second end of the writing track;
    moving magnetic domains of the data recording track through the interconnecting layer toward the writing track; and
    detecting magnetization directions of the magnetic domains moved from the data recording track to the writing track using the magneto-resistance sensor.

10. The method of claim 9, wherein the magnetic domains of the writing track are moved by making a current flow through the first end and the second end of the writing track.

11. The method of claim 9, wherein the magnetic domains of the data recording track are moved by making a current flow through the data recording track and an electrode which is disposed beside the magneto-resistance sensor.

12. The method of claim 9, wherein the detecting of the magnetization directions comprises applying a voltage to the data recording track and the writing track after magnetic domains are moved from the data recording track to the writing track, and contacting the magnetic domains moved to the writing track with the magneto-resistance sensor.

13. The method of claim 9, wherein the writing track and the data recording track comprise a magnetic material having a magnetic anisotropy constant of between $10^5$ J/m$^3$ and $10^7$ J/m$^3$.

14. The method of claim 9, wherein the writing track and the data recording track comprise at least one of CoPt and FePt.

15. The method of claim 9, wherein the interconnecting layer comprises a magnetic material having a magnetic anisotropy constant of between $10^2$ and $10^3$ J/m$^3$.

16. The method of claim 15, wherein the interconnecting layer comprises at least one of NiFe, CoFe, Ni, Fe, Co, and an alloy comprising at least one NiFe, CoFe, Ni, Fe and Co.

* * * * *